United States Patent [19]

Takaishi et al.

[11] Patent Number: 5,572,120
[45] Date of Patent: * Nov. 5, 1996

[54] MAGNETIC POSITION DETECTOR WITH A MOLDED RADIATION SHIELD

[75] Inventors: Tadao Takaishi; Masami Matsumura, both of Himeji, Japan

[73] Assignee: Mitsubishi Denki Kabushiki Kaisha, Tokyo, Japan

[*] Notice: The portion of the term of this patent subsequent to Jan. 11, 2011, has been disclaimed.

[21] Appl. No.: 12,642

[22] Filed: Feb. 3, 1993

[30] Foreign Application Priority Data

Feb. 5, 1992 [JP] Japan .................................. 4-019874

[51] Int. Cl.⁶ .............................. G01B 7/30; G01R 33/06
[52] U.S. Cl. ............................ 324/207.21; 324/207.25; 174/52.2
[58] Field of Search ........................ 324/207.21, 252, 324/207.12, 207.25, 173, 174, 207.20, 251; 338/32 R; 307/309; 123/617; 174/35 MS, 52.2, 52.3, 52.4, 52.6

[56] References Cited

U.S. PATENT DOCUMENTS

| | | | |
|---|---|---|---|
| 4,283,679 | 8/1981 | Ito et al. | 324/207.21 |
| 4,392,375 | 7/1983 | Eguchi et al. | 324/207.21 |
| 4,567,317 | 1/1986 | Ehrlich et al. | 174/35 MS |
| 4,646,011 | 2/1987 | Wallrafen | 324/253 |
| 4,989,574 | 2/1991 | Abe | 324/207.25 |
| 5,004,980 | 4/1991 | Ida et al. | 324/207.21 |
| 5,027,061 | 6/1991 | Palmer et al. | 174/35 MS X |
| 5,055,781 | 10/1991 | Sakakibara et al. | 324/207.21 |
| 5,055,786 | 10/1991 | Wakatsuki et al. | 324/207.21 |
| 5,159,537 | 10/1992 | Okano | 174/35 MS X |
| 5,160,807 | 11/1992 | Fry et al. | 174/35 MS |
| 5,270,645 | 12/1993 | Wheeler et al. | 324/207.21 |
| 5,278,497 | 1/1994 | Ariyoshi | 324/207.21 |

FOREIGN PATENT DOCUMENTS

| | | |
|---|---|---|
| 0145882 | 10/1984 | European Pat. Off. . |
| 4014885 | 5/1990 | Germany . |
| 2238320 | 9/1990 | Japan . |
| 2298815 | 12/1990 | Japan . |

*Primary Examiner*—Sandra L. O'Shea
*Assistant Examiner*—Jay M. Patidar
*Attorney, Agent, or Firm*—Sughrue, Mion, Zinn, Macpeak & Seas

[57] ABSTRACT

A position detector having a movable permanent magnet (5), a circuit board (6) having a magnetic sensor element (1) for detecting the movement of the permanent magnet and a molded resin case (2) supporting the circuit board. The circuit board (6) is surrounded by a box-shaped radiation shield (12) for shielding the circuit board against external electromagnetic radiation. The radiation shield is insert-molded in the mold resin case as its integral part. The radiation shield (12) includes a shield main body (12a) having an open end and a shield cover (12b) closing the open end of the shield main body. The molded resin case (2) has a cavity (2a) open on the same side as the open end of the shield main body (12a) and a case cover (2b) attached to the case opening for closing the cavity.

5 Claims, 3 Drawing Sheets

MAGNETIC POSITION DETECTOR WITH A MOLDED RADIATION SHIELD

BACKGROUND OF THE INVENTION

This invention relates to a position detector and, more particularly, to a position detector in which a movement of a permanent magnet is detected by a magnetic sensor element as a directional change in magnetic flux.

FIG. 4 illustrates a related position detector in sectional view. In this figures, the position detector comprises a magnetic sensor element 1 which includes a pair of magnetoresistance elements made of NiFe ferromagnetic magnetoresistive material formed in a magnetoresistive pattern on a glass substrate. The magnetoresistance elements are molded in a substantially rectangular insulating resin so that a magnetic sensing surface is formed by the magnetoresistance elements on the glass substrate surface.

Reference numeral 2 designates a position detector mold case made for example of a polybuthyleneterephthalate resin, 3 is a rotary shaft rotatably mounted to the case 2, 4 is an arm secured to one end of the rotary shaft.

Reference numeral 5 is a cylindrical permanent magnet secured to the other end of the rotary shaft 3, 6 is a ceramic substrate serving as a circuit board on which a sensor circuit including a wiring pattern and various electronic components are mounted, the magnetic sensor element 1 being mounted on the ceramic circuit board 6 with its magnetic sensing surface placed in parallel to the substrate surface. Reference numeral 7 designates a terminal for taking out an output from the magnetic sensor element 1, 8 is a cover of the resin case 2, 9 is an electromagnetic radiation shield box made of iron and surrounding the resin case 2, and 10 and 11 are washers.

As best seen from FIG. 4, the radiation shield box 9 is a relatively large box-shaped member made of iron with no bottom wall and surrounds substantially the entire outer surface of the case 2 and therefore the ceramic circuit board 6 on which the magnetic sensor circuit is mounted. The radiation shield box 9 is attached to the outer surface of the case 2 by means of screws or bonding agent (not shown). The radiation shield box 9 functions to shield and protect the electronic sensor circuit on the circuit board 6 against the external electromagnetic radiation.

The ceramic circuit board 6 is inserted within the case 2 with its board surface perpendicular to the permanent magnet 5, that is, with the magnetic field from the permanent magnet 5 parallel with the magnetic sensing surface of the magnetic sensor element 1.

When the position detector is applied to a throttle valve (not shown) of an internal combustion engine (not shown), the arm 4 is rotated in accordance with the opening degree of the throttle valve within an air-intake pipe of a vehicular engine, the rotation of the arm 4 is transmitted to the permanent magnet 5 through the rotary shaft 3. As the permanent magnet 5 rotates, the direction of magnetic flux passing in parallel across the magnetic sensing surface of the magnetic sensor element 1 changes, in accordance with which the resistance of the magnetoresistance pattern of the magnetoresistance elements changes.

With the above-described structure of the related position detector, the radiation shield box 9 must be externally attached to the detector case 2 by a suitable securing means such as screws and bonding agent, so that the manufacturing efficiency is not satisfactorily high. Also since the radiation shield box 9 must encase a substantial portion of the detector case, it is inevitably relatively large and heavy. Also, since the shield box 9 constitutes the outer surface of the position detector, the external appearance of the detector is apt to degrade, particularly after long-term usage.

SUMMARY OF THE INVENTION

Accordingly, one object of the present invention is to provide a position detector free from the above discussed problems of the related position detector.

Another object of the present invention is to provide a position detector which makes the manufacture and assembly of the position detector simple and easy.

Another object of the present invention is to provide a position detector which provides an improved appearance.

With the above objects in view, the position detector of the present invention comprises a movable permanent magnet and a circuit board having a magnetic sensor element for detecting the movement of the permanent magnet. A mold resin case which supports the circuit board therein is provided with an insert-molded radiation shield surrounding the circuit board for shielding the circuit board against an external electromagnetic radiation.

The radiation shield may comprise a box-shaped container including a shield main body having an open end and a shield cover closing the open end of the shield main body. The mold resin case may also comprises a cavity open on the same side as the open end of the shield main body and a case cover attached to the case opening for closing the cavity.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENT

Figure 1:
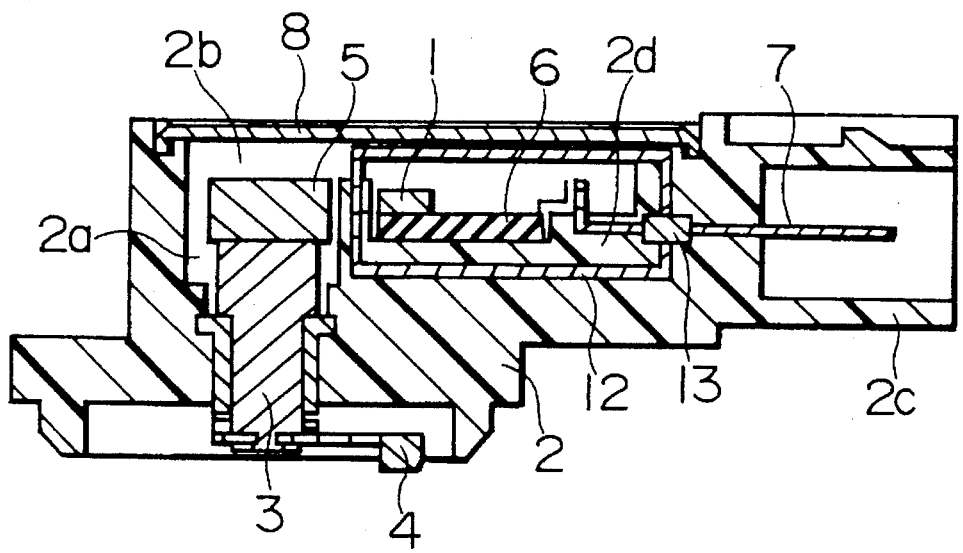
FIG. 1 is a sectional side view of a position detector of the present invention.
Figure 2:
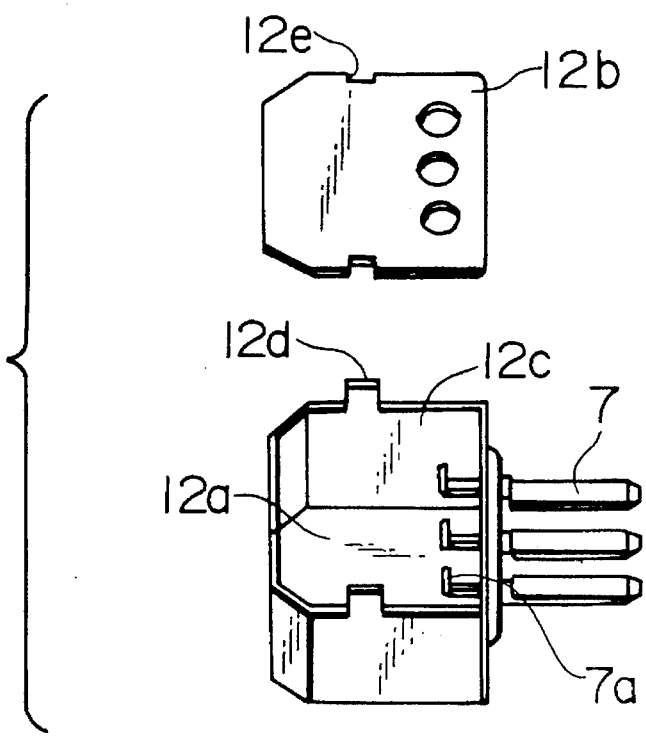
FIG. 2 is an exploded perspective view of the radiation shield illustrated in FIG. 1.
Figure 3:
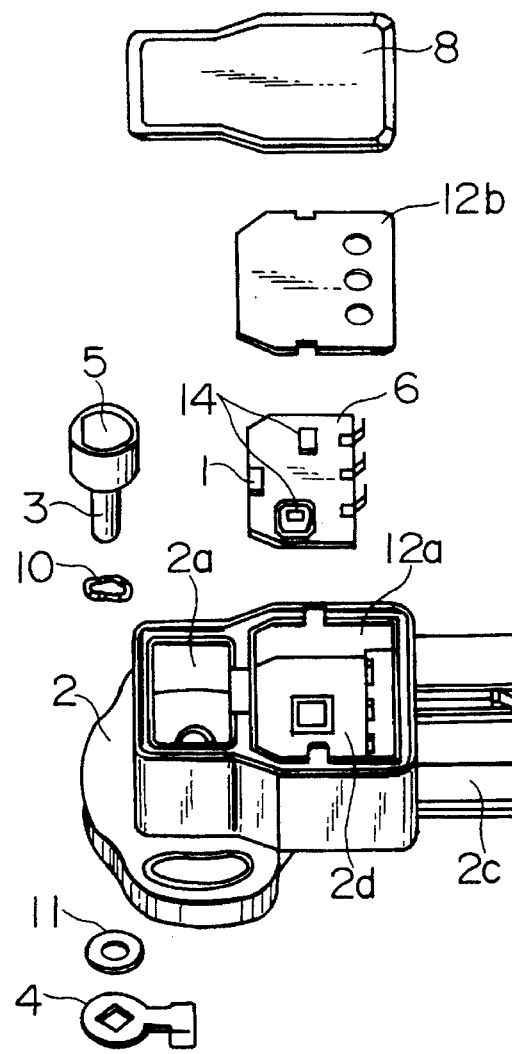
FIG. 3 is an exploded perspective view of the position detector illustrated in FIG. 1.
Figure 4:
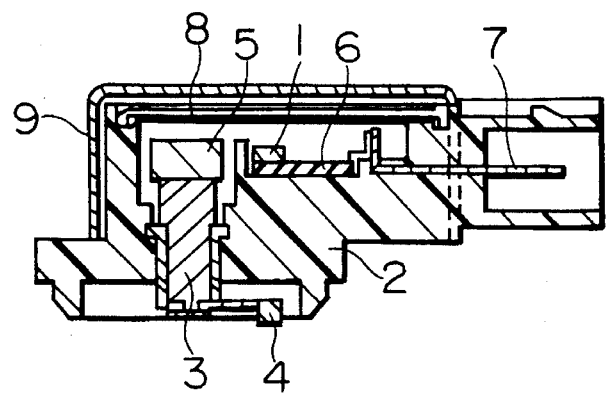
FIG. 4 is a sectional side view of one example of a related position detector.
Figure 5:
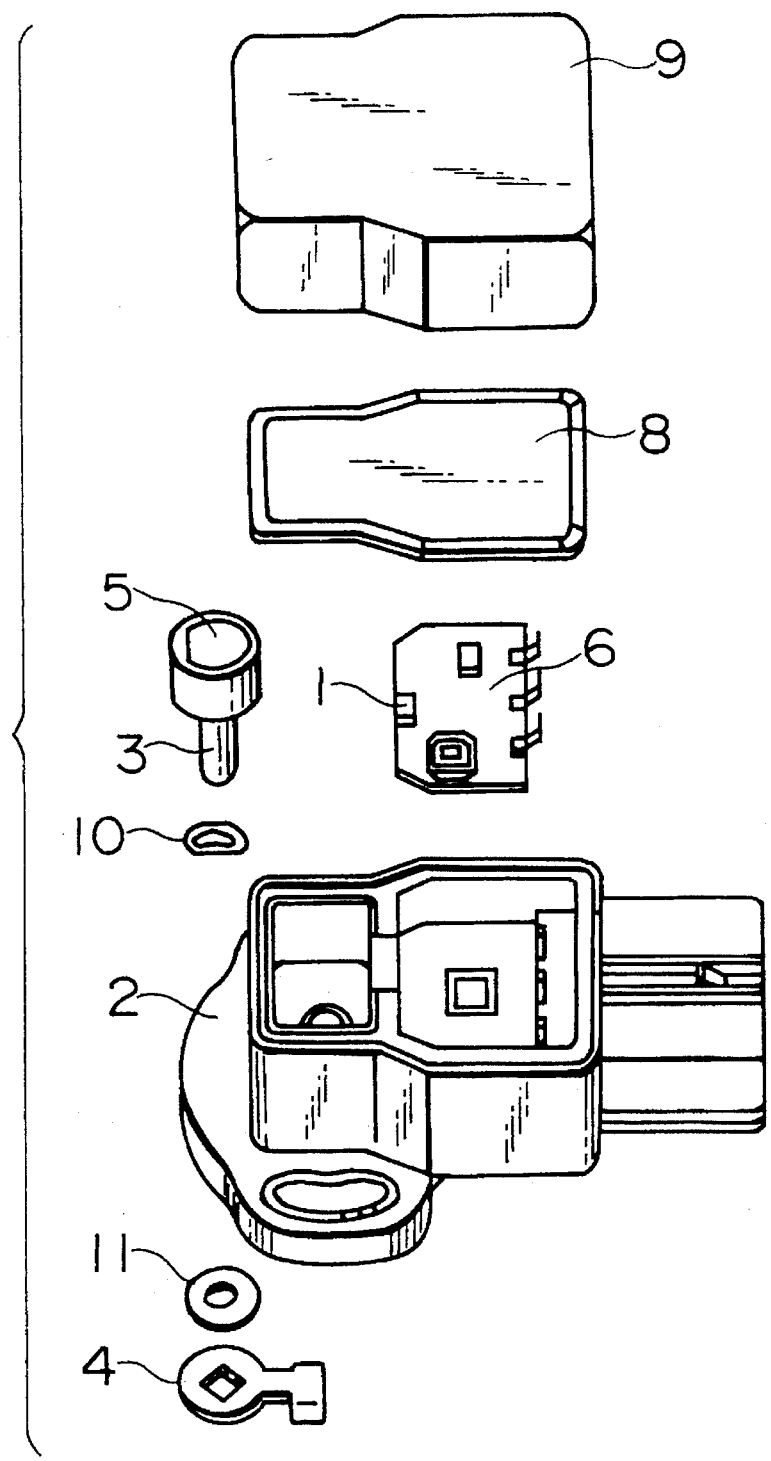
FIG. 5 is an exploded perspective view of the related position detector illustrated in FIG. 4.

FIGS. 1 to 3 illustrate a position detector of the present invention which comprises a molded resin case 2 having a cavity 2a with an opening 2b in which a rotatable permanent magnet 5 is rotatably supported by means of a rotary shaft 3 supported in the case 2 by washers 10 and 11. The rotary shaft 3 has a connecting arm 4 on its outer end for the connection to a movable member such as a throttle valve (not shown) of an engine.

The case 2 also has mounted therein a circuit board 6 having a magnetic sensor circuit 14 including a magnetic sensor element 1 for detecting the movement of the permanent magnet 5.

According to the present invention, the circuit board 6 on which the magnetic sensor circuit 14 is mounted is encased within an insert-molded radiation shield 12 for shielding the circuit board 6 against any external electromagnetic radiation. The radiation shield 12, which may be made of a suitable electromagnetic radiation shielding material such as copper or brass, may be integrally formed with the case 2 by injection molding.

As best seen in FIG. 2, the radiation shield 12 is a box-shaped container including a shield main body 12a having an open end 12c and a shield cover 12b closing the open end 12c of the shield main body 12a. In order to firmly connect the shield cover 12b to the shield main body 12a, a pair of fold tabs 12d are provided on the open end 12c of the main body 12a and a pair of corresponding engaging notches 12e are formed in the edges of the shield cover 12b. The shield main body 12a has mounted thereto terminals 7 by means of penetration capacitors 13 for external connection which forms a connector 2c (FIG. 1) integral with the mold case 2. The inner portions of the terminals 7 have riser ends 7a for internal connection within the radiation shield 12.

As seen from FIGS. 1 and 3, the radiation shield main body 12a is insert-molded in the mold resin case 2 as an integral part thereof, and the mold resin material 2d of the case 2 flows into the inside of the shield main body 12a to cover the bottom wall of the main body 12a and the inner portion of the terminals 7 except for the riser ends 7a. As best seen from FIG. 3, the radiation shield main body 12a is insert-molded within the mold resin case 2 with its open end 12c positioned to open on the same side as the open end 2b of the shield main body 12a. Within the radiation shield main body 12a insert-molded in the mold case 2, the circuit board 6 with the magnetic sensor circuit 14 is mounted and electrically connected to the terminal inner ends 7a.

After the necessary trimming of the magnetic sensor circuit 14 relative to the magnet 5, the shield cover 12b is attached to the shield main body 12a to close the open end 12c to completely shield the interior against the electromagnetic radiation. Then, the case cover 8 can now be attached to the mold resin case 2 to close the case opening 2b for protecting the inside of the position detector.

As has been described, the position detector of the present invention comprises a movable permanent magnet, a circuit board having a magnetic sensor element for detecting the movement of the permanent magnet and a mold resin case supporting the circuit board therein. The mold resin case is provided with an insert-molded radiation shield surrounding the circuit board for shielding the magnetic sensor circuit against an external electromagnetic radiation.

Therefore, separate operation for assembling and securing the radiation shield to the position detector is not necessary, so that the manufacture and assembly of the position detector is simple and easy. Also, since the radiation shield is embedded within the case and surrounds only the magnetic sensor circuit board, the radiation shield can be made relatively small and light. Further, since the radiation shield is not exposed to the outer surface, the external appearance of the detector can be made more attractive and is not degraded through aging.

What is claimed is:

1. A position detector comprising:
   a molded resin case;
   a movable permanent magnet disposed in said resin case;
   a circuit board disposed in and supported by said resin case, and having a magnetic sensor element mounted thereon for detecting the movement of said permanent magnet; and
   a radiation shield surrounding said circuit board and said magnetic sensor for shielding said circuit board and said magnetic sensor against an external electromagnetic radiation, said radiation shield being insert-molded in said molded resin case as an integral part thereof.

2. A position detector as claimed in claim 1, wherein said radiation shield comprises a box-shaped container.

3. A position detector as claimed in claim 1, wherein said radiation shield comprises a box-shaped container including a shield main body having an open end and a shield cover closing said open end of said shield main body.

4. A position detector as claimed in claim 3, wherein said mold resin case comprises a cavity open on the same side as the open end of said shield main body and a case cover attached to said case opening for closing said cavity.

5. A position detector as claimed in claim 4, wherein said main body is provided with a pair of fold tabs and said shield cover is provided with a pair of engaging notches formed in edges of said shield cover, each of said engaging notches corresponding to one of said fold tabs, said shield cover being secured to and electrically connected to said main body by engaging each of said fold tabs with a corresponding engaging notch.

\* \* \* \* \*